US006849466B2

(12) United States Patent
Lee

(10) Patent No.: US 6,849,466 B2
(45) Date of Patent: Feb. 1, 2005

(54) METHOD FOR MANUFACTURING MTJ CELL OF MAGNETIC RANDOM ACCESS MEMORY

(75) Inventor: Seaung Suk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/607,998

(22) Filed: Jun. 30, 2003

(65) Prior Publication Data

US 2004/0014246 A1 Jan. 22, 2004

(30) Foreign Application Priority Data

Jul. 18, 2002 (KR) ......................................... 2002-42059

(51) Int. Cl.⁷ .............................................. H01L 21/00
(52) U.S. Cl. .......................... 438/3; 438/653; 438/783; 438/785; 438/971; 257/296; 257/285; 257/300
(58) Field of Search ................................ 438/653, 783, 438/785, 971; 257/296, 285, 300

(56) References Cited

U.S. PATENT DOCUMENTS 6,664,579 B2 * 12/2003 Kim et al. ................... 257/296

* cited by examiner

Primary Examiner—David Nelms
Assistant Examiner—Renee R. Berry
(74) Attorney, Agent, or Firm—Jacobson Holman PLLC

(57) ABSTRACT

A method for fabricating a MTJ cell of a magnetic random access memory (MRAM) using a semiconductor film as a tunnel barrier layer is disclosed. The method comprises the steps of: forming a pinned ferromagnetic layer on a connection layer; forming a tunnel barrier layer using a semiconductor film on the pinned ferromagnetic layer; and forming a free ferromagnetic layer on the tunnel barrier layer.

14 Claims, 4 Drawing Sheets

METHOD FOR MANUFACTURING MTJ CELL OF MAGNETIC RANDOM ACCESS MEMORY

BACKGROUND OF THE INVENTION

1. Field of the Invention

The present invention relates to a method for fabricating a MTJ cell of a magnetic random access memory (hereinafter, referred to as 'MRAM'), having a higher speed than a SRAM, integration density as high as a DRAM, and a property of a nonvolatile memory such as a flash memory.

2. Description of the Prior Art

Most of the semiconductor memory manufacturing companies have developed the MRAM using a ferromagnetic material as one of the next generation memory devices.

The MRAM is a memory device for reading and writing information. It has multi-layer ferromagnetic thin films, and operates by sensing current variations according to a magnetization direction of the respective thin film. The MRAM has high speed and low power consumption, and allows high integration density due to the special properties of the magnetic thin film. The MRAM also performs a nonvolatile memory operation similar to a flash memory.

The MRAM is a memory device which uses a giant magneto resistive (GMR) phenomenon or a spin-polarized magneto-transmission (SPMT) generated when the spin influences electron transmission.

The MRAM using the GMR utilizes the phenomenon that resistance is remarkably varied when spin directions are different in two magnetic layers having a non-magnetic layer therebetween to implement a GMR magnetic memory device.

The MRAM using the SPMT utilizes the phenomenon that larger current transmission is generated when spin directions are identical in two magnetic layers having an insulating layer therebetween to implement a magnetic permeable junction memory device.

The MRAM comprises a transistor and a MTJ cell, a diode and a MTJ cell, and a MTJ cell.

FIG. 1 is a cross-sectional diagram illustrating a MTJ cell structure of a conventional MRAM.

Referring to FIG. 1, a lower insulating layer 11 is formed on a semiconductor substrate (not shown). The lower insulating film 11 is an insulating film planarizing the entire surface of the semiconductor substrate having a device isolation film (not shown), a transistor (not shown) comprising a first wordline which is a read line and a source/drain region, a ground line (not shown), a conductive layer (not shown), and a second wordline (not shown) which is a write line thereon.

Next, a connection layer 13 electrically connected to the conductive layer is formed using Ta.

A pinned ferromagnetic layer 15 electrically connected to the connection layer 13 is then formed.

The pinned ferromagnetic layer 15 includes a stacked structure of a NiFe layer, a PtMn layer, a CoFe layer, a Ru layer and a CoFe layer.

Thereafter, a tunnel barrier layer 17 is formed on the pinned ferromagnetic layer 15.

Here, the tunnel barrier layer 17 is formed using $Al_2O_3$ and has a thickness of less than 2 nm which is the minimum thickness required for data sensing.

A free ferromagnetic layer 19 is then formed on the tunneling oxide film 17.

The free ferromagnetic layer 19 includes a stacked structure of a CoFe layer and a NiFe layer.

Thereafter, a metal line is formed by depositing a Ta film 21 and a Ru film 23 on the free ferromagnetic layer 19.

FIG. 2 is a graph illustrating the relationship between the resistance characteristic per unit area of MTJ cell and the minimum area of MTJ cell for implementation of the device.

FIG. 3 is a graph illustrating the relationship between the thickness of an alumina tunnel barrier layer, and the resistance characteristic per unit area of MTJ cell.

As described above, a conventional method for fabricating a MRAM is advantageous in fabricating a MRAM having high density because a MTJ occupying smaller area can be implemented as the resistance value per unit area of MTJ cell becomes lower as shown in FIG. 2 by forming the tunnel barrier layer using alumina.

However, when an insulating layer such as an alumina layer is used as a tunnel barrier layer, variations in the resistance "RA" of MTJ cell which is dependent on the thickness of alumina layer as shown in FIG. 3. As a result, it is difficult to satisfy a current process margin where the thickness variation of the alumina layer allowed within the limit of the resistance variation of a device must be less than 0.1 nm

SUMMARY OF THE INVENTION

It is an object of the present invention to provide a method for fabricating a MRAM wherein the electric conductivity of a tunnel barrier layer having a thickness 1–10 times greater than that of a conventional tunnel barrier layer is controlled by impurity concentration to obtain sufficient process margin and improve characteristics, reliability, yield and productivity of a device.

In order to achieve the above object, there is provided a method for fabricating a MTJ cell of a MRAM, comprising the steps of: forming a pinned ferromagnetic layer on a connection layer; forming a tunnel barrier layer on the pinned ferromagnetic layer by depositing a semiconductor film; and forming a free ferromagnetic layer on the tunnel barrier layer.

It is preferable that the semiconductor film consists of a pure Group IV element.

It is also preferable that the semiconductor film consists of a Group IV element and includes a Group III element or a Group V element as an impurity.

It is also preferable that the semiconductor film is a compound semiconductor film consisting of a Group III element and a Group V element.

DETAILED DESCRIPTION OF THE PREFERRED EMBODIMENTS

The present invention will be explained in detail referring to the accompanying drawings.

Figure 1:
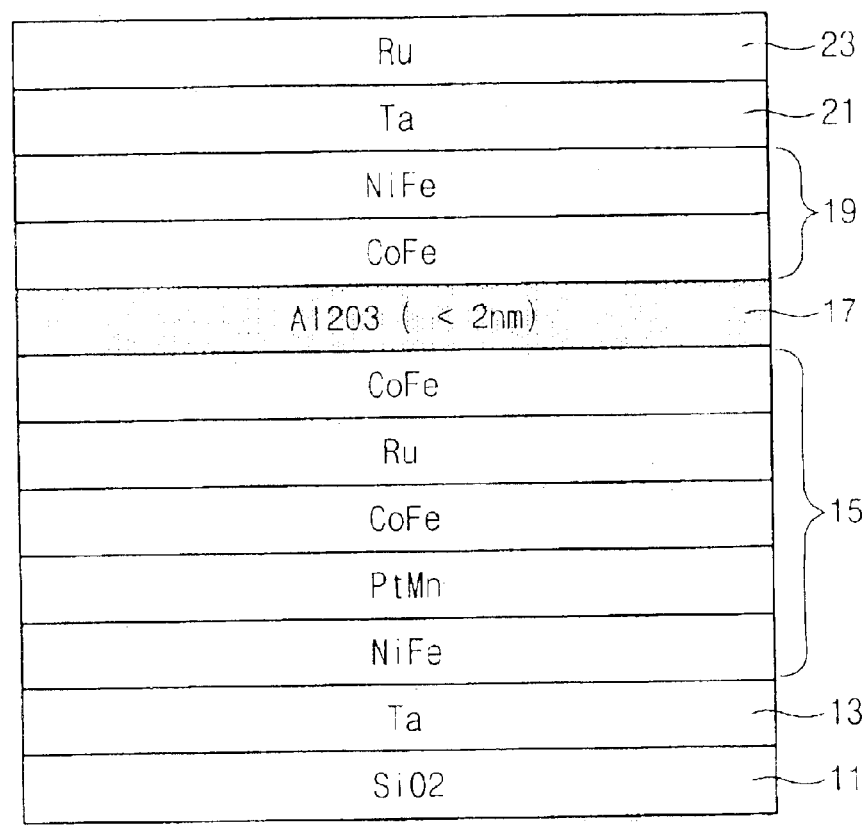
FIG. 1 is a cross-sectional diagram illustrating a MTJ cell structure of a conventional MRAM.
Figure 2:
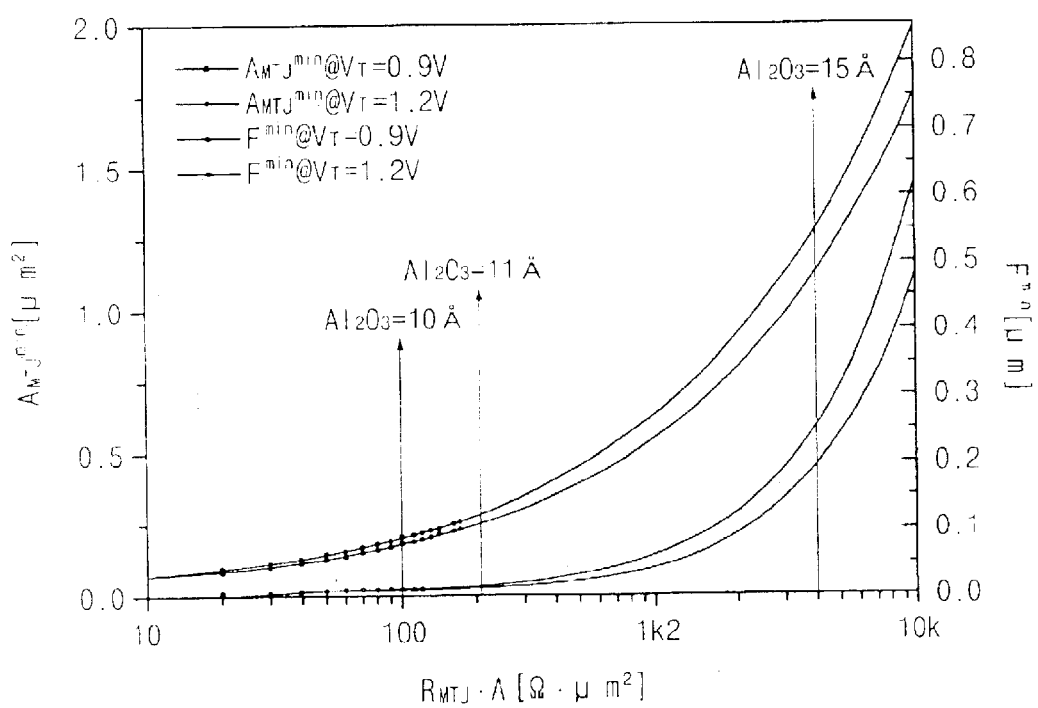
FIGS. 2 and 3 are graphs illustrating characteristic variations of a MTJ cell.
Figure 3:
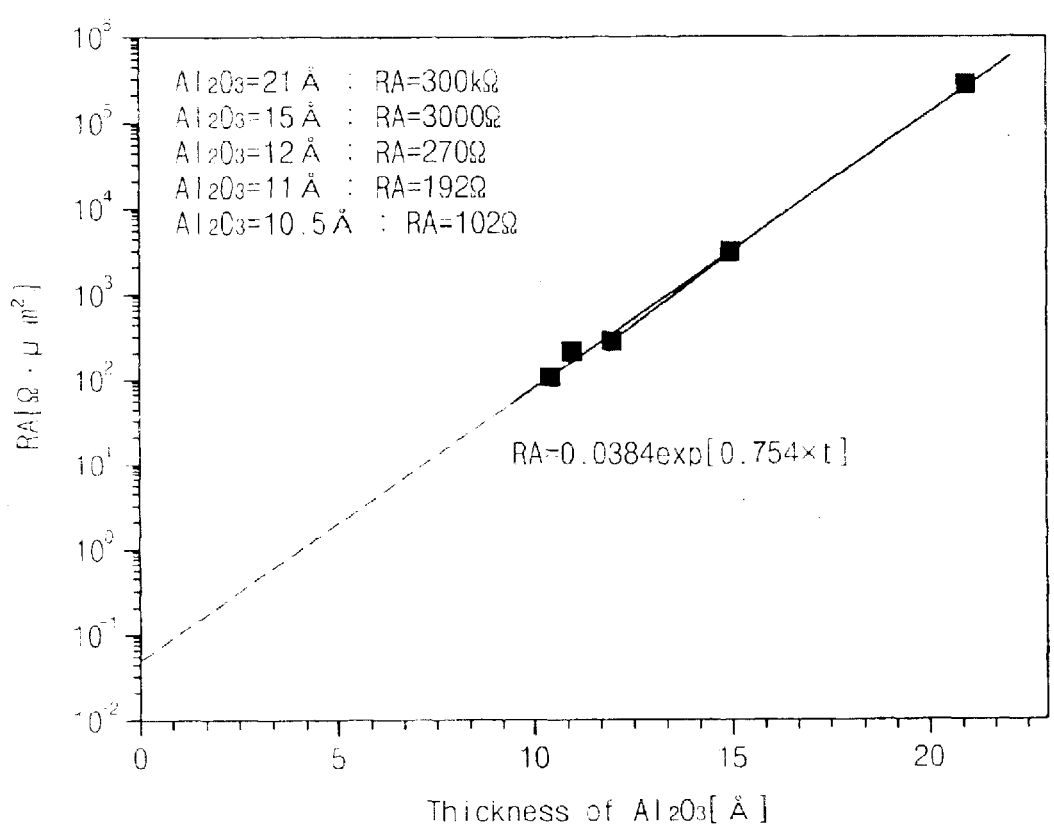
Figure 4:
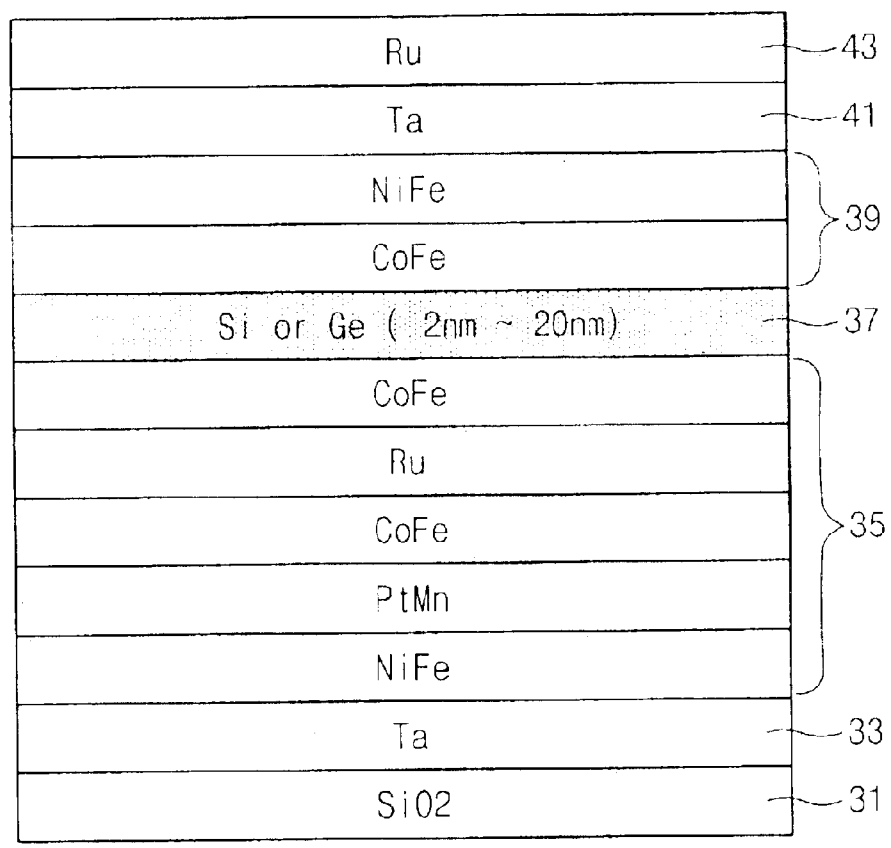
FIG. 4 is a cross-sectional diagram illustrating a MTJ cell structure of a MRAM according to a preferred embodiment of the present invention.

FIG. 4 is a cross-sectional diagram illustrating a MTJ cell of a MRAM according to a preferred embodiment of the present invention.

Referring to FIG. 4, a lower insulating layer 31 is formed on a semiconductor substrate (not shown).

The lower insulating film 31 is an insulating film planarizing the entire surface of the semiconductor substrate having a device isolation film (not shown), a transistor (not shown) comprising a first wordline which is a read line and a source/drain region, a ground line (not shown), a conductive layer (not shown), and a second wordline (not shown) which is a write line thereon.

Then, a connection layer 33 electrically connected to the conductive layer is formed using Ta.

A pinned ferromagnetic layer 35 electrically connected to the connection layer 33 is formed.

The pinned ferromagnetic layer 35 includes a stacked structure of a NiFe layer, a PtMn layer, a CoFe layer, a Ru layer and a CoFe layer.

Thereafter, a tunnel barrier layer 37 is formed on the pinned ferromagnetic layer 35. Preferably, the tunnel barrier layer 37 has a thickness ranging from 2 to 20 nm.

Preferably, the tunnel barrier layer 37 is a semiconductor film consisting of a pure Group IV element. Group III or Group V elements such as B, P, As may be added to the tunnel barrier layer 37 consisting of a pure Group IV element for controlling electric conductivity. A compound semiconductor film consisting of a Group III element such as Ga or In and a Group V element such as As or P may be also used as the tunnel barrier layer 37.

Thereafter, a free ferromagnetic layer 39 is formed on the tunnel barrier layer 37.

The free ferromagnetic layer 39 includes a stacked structure of a CoFe layer and a NiFe layer.

A metal line is then formed on the free ferromagnetic layer 39 by depositing a Ta film 41 and a Ru film 43.

As discussed above, the improved method for fabricating a MTJ cell of a MRAM wherein the electric conductivity of a tunnel barrier layer having a thickness 1–10 times greater than that of a conventional tunnel barrier layer is controlled by impurity concentration to obtain sufficient process margin and improve characteristics, reliability, yield and productivity of a device.

What is claimed is:

1. A method for fabricating a MTJ cell of a MRAM, comprising the steps of:

forming a pinned ferromagnetic layer on a connection layer;

forming a tunnel barrier layer on the pinned ferromagnetic layer using a semiconductor film that is a pure Group IV semiconductor film; and forming a free ferromagnetic layer on the tunnel barrier layer.

2. A method for fabricating a MTJ cell of a MRAM, comprising the steps of:

forming a pinned ferromagnetic layer on a connection layer;

forming a tunnel barrier layer on the pinned ferromagnetic layer using a semiconductor film, wherein the semiconductor film is a Group IV semiconductor film having Group III elements added thereto; and forming a free ferromagnetic layer on the tunnel barrier layer.

3. A method for fabricating a MTJ cell of a MRAM, comprising the steps of:

forming a pinned ferromagnetic layer on a connection layer;

forming a tunnel barrier layer on the pinned ferromagnetic layer using a semiconductor film, wherein the semiconductor film is a Group IV semiconductor film having Group V elements added thereto; and forming a free ferromagnetic layer on the tunnel barrier layer.

4. The method according to claim 1, wherein said tunnel barrier layer has a thickness ranging from 2 to 20 nm.

5. The method according to claim 1, wherein said pure Group IV semiconductor film is Ge.

6. The method according to claim 5, wherein said tunnel barrier layer has a thickness ranging from 2 to 20 nm.

7. The method according to claim 1, wherein said pure Group IV semiconductor film is Si.

8. The method according to claim 7, wherein said tunnel barrier layer has a thickness ranging from 2 to 20 mm.

9. The method according to claim 2, wherein said tunnel barrier layer has a thickness ranging from 2 to 20 nm.

10. The method according to claim 2, wherein said Group IV semiconductor film is Ge.

11. The method according to claim 2, wherein said Group IV semiconductor film is Si.

12. The method according to claim 3, wherein said tunnel barrier layer has a thickness ranging from 2 to 20 nm.

13. The method according to claim 3, wherein said Group IV semiconductor film is Ge.

14. The method according to claim 3, wherein said Group IV semiconductor film is Si.

* * * * *